(12) United States Patent
Tan et al.

(10) Patent No.: US 10,145,874 B2
(45) Date of Patent: Dec. 4, 2018

(54) S-PARAMETER MEASUREMENTS USING REAL-TIME OSCILLOSCOPES

(71) Applicant: Tektronix, Inc., Beaverton, OR (US)

(72) Inventors: Kan Tan, Portland, OR (US); John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 340 days.

(21) Appl. No.: 14/673,747

(22) Filed: Mar. 30, 2015

(65) Prior Publication Data

US 2016/0018450 A1    Jan. 21, 2016

Related U.S. Application Data

(60) Provisional application No. 62/026,434, filed on Jul. 18, 2014.

(51) Int. Cl.
| | | |
|---|---|---|
| *G01R 27/28* | (2006.01) | |
| *G01R 27/06* | (2006.01) | |
| *G01R 21/133* | (2006.01) | |
| *G01R 23/00* | (2006.01) | |
| *G01R 23/02* | (2006.01) | |
| *G01R 31/28* | (2006.01) | |
| *G01R 27/16* | (2006.01) | |

(52) U.S. Cl.
CPC ......... *G01R 27/28* (2013.01); *G01R 31/2841* (2013.01); *G01R 27/06* (2013.01); *G01R 27/16* (2013.01); *G01R 31/2839* (2013.01)

(58) Field of Classification Search
CPC .... G01R 27/28; G01R 27/06; G01R 31/2841; G01R 27/16; G01R 31/2839

USPC ............... 702/118, 66; 324/638, 612
See application file for complete search history.

(56) References Cited

U.S. PATENT DOCUMENTS

| | | | | |
|---|---|---|---|---|
| 4,139,817 A | * | 2/1979 | Boer ................. | G01R 1/06788 200/11 G |
| 2004/0027138 A1 | | 2/2004 | Pickerd | |
| 2007/0164237 A1 | * | 7/2007 | Bernhardt ............ | H01J 37/248 250/492.21 |
| 2013/0076372 A1 | | 3/2013 | Dascher | |

OTHER PUBLICATIONS

El-Akhdar et al., "Calibrated Oscilloscopic System for RF Time-Domain Characterization of Non-Linear Devices", 2013 13th Mediterranean Microwave Symposium, Sep. 1, 2013, 4 pages.
(Continued)

*Primary Examiner* — Ly D Pham
(74) *Attorney, Agent, or Firm* — Miller Nash Graham & Dunn; Kevin D. Dothager

(57) ABSTRACT

A method for determining scattering parameters of a device under test using a real-time oscilloscope. The method includes calculating a reflection coefficient of each port of a device under test with N ports, wherein N is greater than one, based on a first voltage measured by the real-time oscilloscope when a signal is generated from a signal generator. The method also includes determining an insertion loss coefficient of each port of the device under test, including calculating the insertion loss coefficient of the port of the device under test to be measured based on a second voltage measured by the real-time oscilloscope when a signal is generated from a signal generator.

5 Claims, 4 Drawing Sheets

(56) References Cited

OTHER PUBLICATIONS

Henze A. et al., "1 GHz Automatic 2-Port Vector Network Analyzer Using Common Laboratory Instruments", 2014 IEEE International Instrumentation and Measurement Technology Conference Proceedings, IEEE, May 12, 2014, 5 pages.
Makarov, "N2PK Vector Network Analyzer", dated Jan. 27, 2007, retrieved from the internet: URL: http://www.makarov.ca/vna_bridge_hack.htm, retrieved on Jun. 28, 2016, 5 pages.
European Search Report and Written Opinion for EP Application No. 15178972.4, dated Jul. 6, 2016, 10 pages.
U.S. Appl. No. 14/267,697, filed May 1, 2014.
"PrecisionProbe for Bandwidths up to 33 GHz", Data Sheet, Agilent Technologies, Inc., USA, May 18, 2012.
"S-Parameter Design", Agilent AN 154, Application Note, Agilent Technologies, Inc., USA, Jun. 20, 2006.
"Differences in Application Between Power Dividers and Power Splitters", Application Note, Agilent Technologies, Inc., USA, Aug. 24, 2007.
Mongia, R.K., et al., "RF and Microwave Coupled-Line Circuits", Second Edition, Artech House, 2007, Norwood, MA.

\* cited by examiner

S-PARAMETER MEASUREMENTS USING REAL-TIME OSCILLOSCOPES

BENEFIT

This application claims benefit of U.S. Provisional Application No. 61/026,434, filed Jul. 18, 2014, titled S-PARAMETER MEASUREMENTS USING REAL-TIME OSCILLOSCOPES, which is incorporated herein by reference in its entirety.

TECHNICAL FIELD

This disclosure relates to a method for measuring complete two-port and multi-port scattering parameters (S-parameters) of a device under test (DUT) using a real-time oscilloscope, a power divider and a signal source.

BACKGROUND

Traditionally a vector network analyzer or a time-domain reflectometer (TDR) system with a sampling oscilloscope has been required to obtain S-parameter measurements for characterizations of a device under test (DUT). If a fixture is used to measure the S-parameters, then once the S-parameters of the fixture have been measured and the S-parameters of the DUT plus the fixture have been measured, a full de-embed operation can be performed to obtain only characteristics of the DUT by taking out the errors due to the fixture. However, vector network analyzers and TDR systems are expensive.

As bit rate goes higher, high speed serial data link simulation and measurements require using S-parameters of the DUT to characterize the components within the simulated link for embedding and de-embedding operations. For example, as seen in FIG. 1, the output impedance of the transmitter 100, the input impedance of the receiver 102, and the full S-parameters of the channel 104 are all needed to fully characterize and simulate the link so that accurate test and measurements of the DUT may be made.

Real-time oscilloscopes are widely used to do high speed serial data link debugging, testing, and measurements. It is desired to use the real-time oscilloscopes to also measure the S-parameters of the DUT and then use the measured S-parameters for other measurements and simulations, without having to use multiple instruments.

Embodiments of the disclosed technology address these and other limitations in the prior art.

SUMMARY

Certain embodiments of the disclosed technology include a method for determining scattering parameters of a device under test using a real-time oscilloscope. The method includes determining a reflection coefficient of each port of a device under test with N ports, wherein N is an integer greater than or equal to one, including terminating the ports of the device under test not being measured with a resistor, and calculating the reflection coefficient of the port of the device under test to be measured based on a first voltage measured by the real-time oscilloscope when a signal is generated from a signal generator. The method also includes determining an insertion loss and/or crosstalk coefficient between two different ports of the device under test, including calculating the insertion loss and/or a crosstalk between the ports of the device under test to be measured based on a second voltage measured by the real-time oscilloscope when a signal is generated from a signal generator.

Certain embodiments of the disclosed technology also include a system, comprising a power divider, a signal generator in communication with the power divider, the real-time oscilloscope and/or a device under test, the signal generator configured to generate a signal, and a real-time oscilloscope in communication with the signal generator, the power divider and the device under test. The real-time oscilloscope is configured to calculate a reflection coefficient of each port of a device under test with N ports, wherein N is greater than or equal to one, measured based on a first voltage measured by the real-time oscilloscope when a signal is generated from a signal generator, and calculating an insertion loss and/or a crosstalk between the ports of the device under test to be measured based on a second voltage measured by the real-time oscilloscope when a signal is generated from a signal generator. A synchronized trigger between the signal generator and the real-time oscilloscope provides an absolute time reference for return loss coefficient, insertion loss and cross talk measurements.

DETAILED DESCRIPTION

Figure 1:
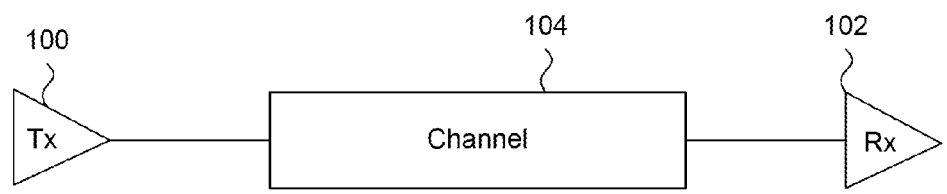
FIG. 1 illustrates a serial data link system.

In the drawings, which are not necessarily to scale, like or corresponding elements of the disclosed systems and methods are denoted by the same reference numerals.

Figure 2:
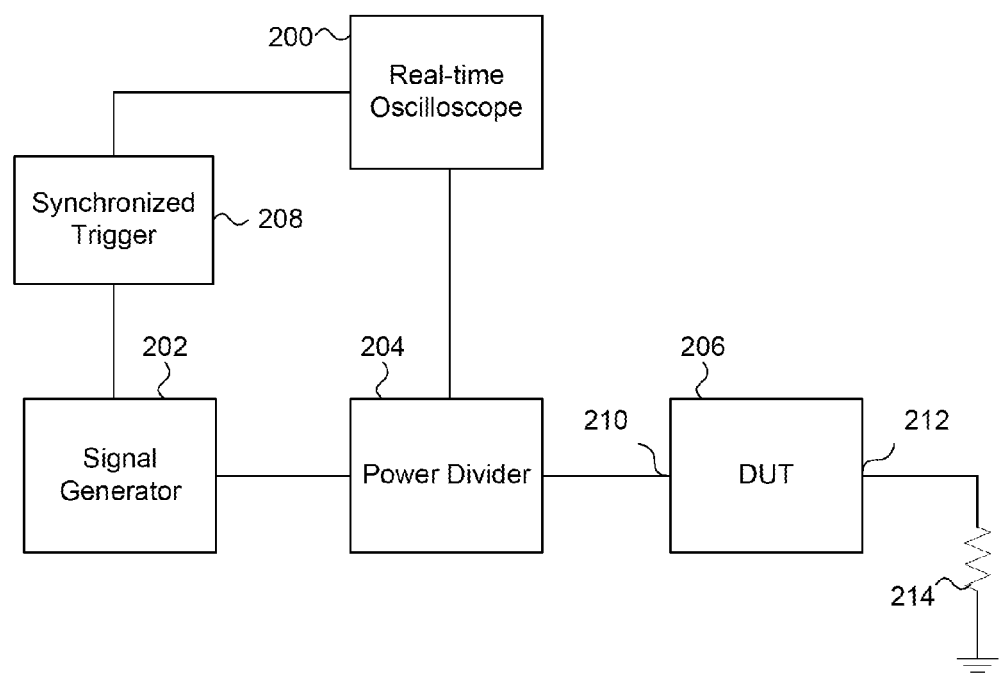
FIG. 2 is a block diagram of a return loss coefficient measurement system according to embodiments of the disclosed technology.

The disclosed technology measures S-parameters of a DUT 206 using a real-time oscilloscope 200, a signal generator 202, and a power divider 204, as shown in FIG. 2. A two-port DUT 206 has four S-parameters: reflection coefficients $s_{11}^{DUT}$, $s_{22}^{DUT}$ and insertion loss and/or crosstalk terms $s_{12}^{DUT}$, $s_{21}^{DUT}$.

In the setup shown in FIG. 2, the synchronized trigger 208 between the signal generator 202 and the real-time oscilloscope 200 provides an absolute time reference for the reflection coefficients and the insertion loss and/or crosstalk coefficients. This synchronizing action establishes a zero time or zero phase reference point for the acquisition system of the oscilloscope 200. Signal generator 202 may either output sweep sine signals or fast step signals that may cover a wide bandwidth. For example, a fast step signal can cover more than 50 GHz bandwidth. For swept sine signals, zero phase is the reference point. For fast step signals, zero time is the reference point.

Figure 6:
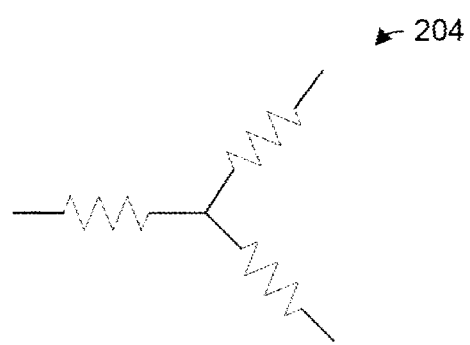
FIG. 6 is a power divider of FIG. 2.

Power divider 204 may be any type of power divider or splitter. For example, power divider 204 may be a power divider having three 16⅔ Ohm resistors at three branches creating a three way power network, as seen in FIG. 6.

Figure 3:
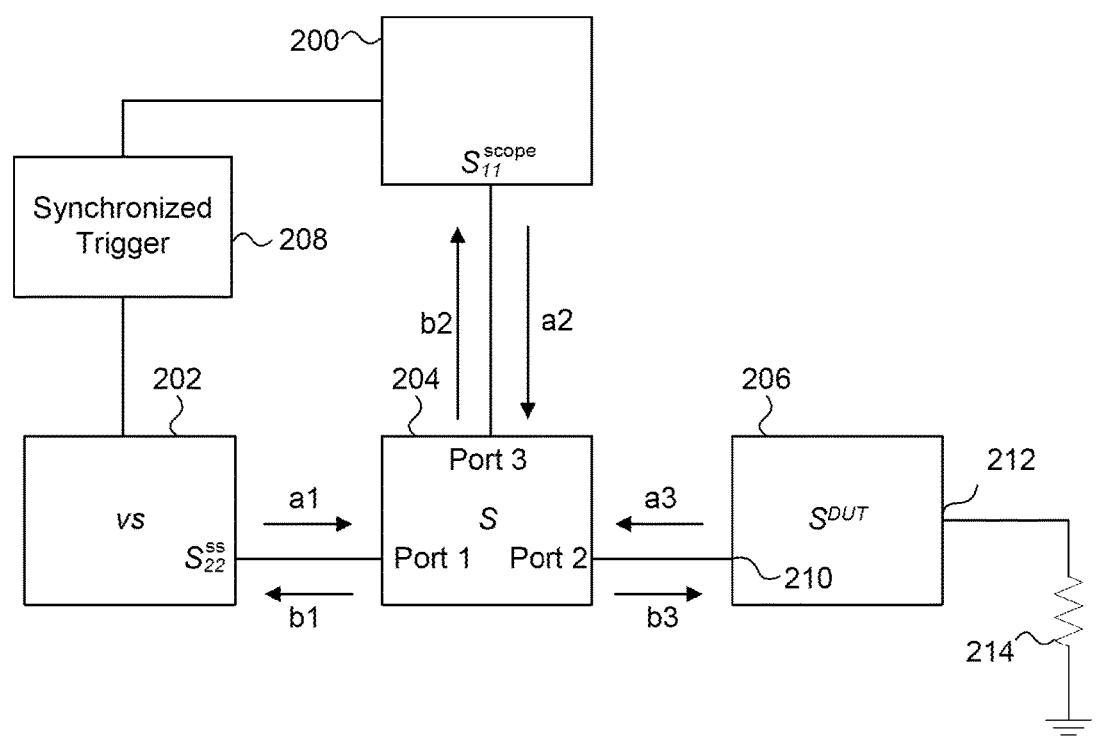
FIG. 3 is a signal flow diagram of the system shown in FIG. 2.

FIG. 3 illustrates a signal flow diagram of the system shown in FIG. 2.

The power divider 204, as seen in the signal flow diagram of FIG. 3, is a three-port network and characterized by a three port S-parameters data set:

$$s = \begin{bmatrix} s_{11} & s_{12} & s_{13} \\ s_{21} & s_{22} & s_{23} \\ s_{31} & s_{32} & s_{33} \end{bmatrix} \quad (1)$$

The S-parameters of the power divider 204 may be measured ahead of time and saved in a memory (not shown) of the real-time oscilloscope 200. The DUT 206 is modeled as a two port S-parameters data set $s^{DUT}$.

To measure the reflection coefficient $s_{11}^{DUT}$ of port one 210 of the DUT 206, port two 212 of the DUT 206 is terminated with an ideal 50 Ohm resistor 214. The signal generator 202 is modeled with its ideal voltage $v_s$ and has the reflection coefficient $s_{22}^{ss}$ at the output port. The real-time oscilloscope 200 has the reflection coefficient $s_{11}^{scope}$ at its input port.

As the power divider is a three-port network, with port two being terminated by DUT 206, a two-port system can be derived from port one and port three of the power divider 204 as follows:

$$\begin{bmatrix} b_1 \\ b_2 \end{bmatrix} = \left\{ \begin{bmatrix} s_{11} & s_{12} \\ s_{21} & s_{22} \end{bmatrix} + \begin{bmatrix} s_{13} \\ s_{23} \end{bmatrix} s_{11}^{DUT}[1 - s_{33}s_{11}^{DUT}][s_{31} \quad s_{32}] \right\} \begin{bmatrix} a_1 \\ a_2 \end{bmatrix} \quad (2)$$

Let equation (3):

$$\tilde{s} = \begin{bmatrix} \tilde{s}_{11} & \tilde{s}_{12} \\ \tilde{s}_{21} & \tilde{s}_{22} \end{bmatrix} \quad (3)$$

$$= \begin{bmatrix} s_{11} & s_{12} \\ s_{21} & s_{22} \end{bmatrix} + \begin{bmatrix} s_{13} \\ s_{23} \end{bmatrix} s_{11}^{DUT}[1 - s_{33}s_{11}^{DUT}]^{-1}[s_{31} \quad s_{32}]$$

denote equation (4):

$$\tilde{s}_{11}^{DUT} = s_{11}^{DUT}[1 - s_{33}s_{11}^{DUT}]^{-1} \quad (4)$$

Then equation (3) can be re-written as:

$$\begin{bmatrix} \tilde{s}_{11} & \tilde{s}_{12} \\ \tilde{s}_{21} & \tilde{s}_{22} \end{bmatrix} = \begin{bmatrix} s_{11} + s_{13}\tilde{s}_{11}^{DUT}s_{31} & s_{12} + s_{13}\tilde{s}_{11}^{DUT}s_{32} \\ s_{21} + s_{23}\tilde{s}_{11}^{DUT}s_{31} & s_{22} + s_{23}\tilde{s}_{11}^{DUT}s_{32} \end{bmatrix} \quad (5)$$

From equation (2), the transfer function from the voltage source of the signal generator 202 to the input to the real-time oscilloscope can be derived as:

$$\frac{b_2}{v_s} = \frac{1}{2} \cdot \frac{1 - s_{22}^{ss}}{(1 - s_{22}^{ss}\tilde{s}_{11})\tilde{s}_{21}^{-1}(1 - \tilde{s}_{22}s_{11}^{scope}) - s_{22}^{ss}\tilde{s}_{12}s_{11}^{scope}} \quad (6)$$

The terms of equation (5) may be inserted into equation (6), and equation (6) can be rewritten as:

$$\frac{b_2}{v_s} = \frac{1}{2} \cdot \frac{(1 - s_{22}^{ss})(s_{21} + s_{23}\tilde{s}_{11}^{DUT}s_{31})}{1 - s_{22}^{ss}(s_{11} + s_{12}\tilde{s}_{11}^{DUT}s_{31}) - (s_{22} + s_{23}\tilde{s}_{11}^{DUT}s_{32})s_{11}^{scope} + \begin{bmatrix} (s_{11}s_{22} - s_{21}s_{12}) + \\ (s_{13}s_{31}s_{22} + s_{23}s_{32}s_{11} - s_{23}s_{31}s_{12} + s_{13}s_{32}s_{21})\tilde{s}_{11}^{DUT} \end{bmatrix} s_{22}^{ss}s_{11}^{scope}} \quad (7)$$

In equation (7), $v_s$ is the voltage source value of the signal generator 202 and may be obtained during a calibration process and saved in the memory of the real-time oscilloscope 200. $b_2$ is the voltage acquired by the oscilloscope 200 when $v_s$ is generated, so it is known. As discussed above, all the S-parameter terms for the power divider 204 may be measured ahead of time, and stored in the memory of the oscilloscope 200. $s_{22}^{ss}$, corresponding to the signal source output impedance, may also be measured ahead of time and stored in memory. $s_{11}^{scope}$, corresponding to the real-time oscilloscope 200 input impedance, may be measured ahead of time and stored in the memory as well. The only unknown, therefore, is $\tilde{s}_{11}^{DUT}$ which may be computed from equation (7). Once $\tilde{s}_{11}^{DUT}$ is obtained from equation (7), $s_{11}^{DUT}$, the reflection coefficient of the DUT 206 may be calculated using equation (4) above.

Equation (7) may be simplified with some assumptions. First, the S-parameters of an ideal power divider is:

$$s = \begin{bmatrix} s_{11} & s_{12} & s_{13} \\ s_{21} & s_{22} & s_{23} \\ s_{31} & s_{32} & s_{33} \end{bmatrix} = \begin{bmatrix} 0 & \frac{1}{2} & \frac{1}{2} \\ \frac{1}{2} & 0 & \frac{1}{2} \\ \frac{1}{2} & \frac{1}{2} & 0 \end{bmatrix} \quad (8)$$

For an ideal signal generator and an ideal real-time oscilloscope, the signal source impedance and oscilloscope input impedance are zero:

$$s_{22}^{ss} = 0, \quad s_{11}^{scope} = 0. \quad (9)$$

Assuming the S-parameters of the power divider 204, signal generator 202, and real-time oscilloscope 200 are their ideal models, then equation (7) can be simplified as:

$$\frac{b_2}{v_s} = \frac{1}{4}\left(1 + \frac{1}{2}s_{11}^{DUT}\right) \quad (10)$$

However, in the real world, the S-parameters of the power divider 204, signal generator 202 and real-time oscilloscope 200 will not be ideal, but the following may be assumed to be true:

$$s_{22}^{ss}s_{11}^{scope} \ll 1, \quad s_{22}^{ss}s_{11} \ll 1, \quad s_{22}s_{11}^{scope} \ll 1 \quad (11)$$

Then equation (7) can be approximated as:

$$\frac{b_2}{v_s} = \frac{1}{2} \cdot \frac{(1 - s_{22}^{ss})(s_{21} + s_{23}\tilde{s}_{11}^{DUT}s_{31})}{1 - s_{22}^{ss}s_{12}\tilde{s}_{11}^{DUT}s_{31} - s_{23}\tilde{s}_{11}^{DUT}s_{32}s_{11}^{scope}} \quad (12)$$

Equation (12) provides a working practical approximation of the reflection coefficient of the DUT 206.

To measure $s_{22}^{DUT}$, the port two reflection coefficient of the DUT 206, port two 212 of DUT 206 is connected to port one of the power divider 202 and port one 210 of the DUT 206 is terminated with an ideal 50 Ohm resistor 214. Then, the same procedure used to measure the port one 210 reflection coefficient $s_{11}^{DUT}$ discussed above may be repeated to calculate the port two 212 reflection coefficient $s_{22}^{DUT}$.

Figure 4:
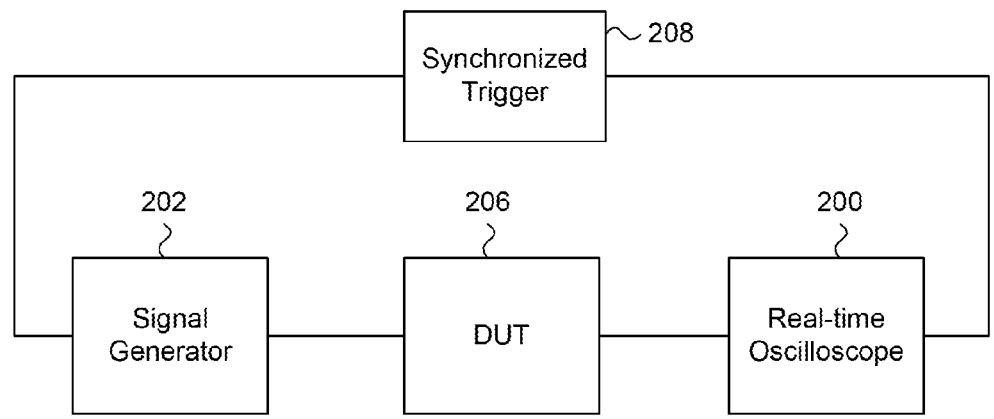
FIG. 4 is a block diagram of an insertion loss measurement system according to embodiments of the disclosed technology.
Figure 5:
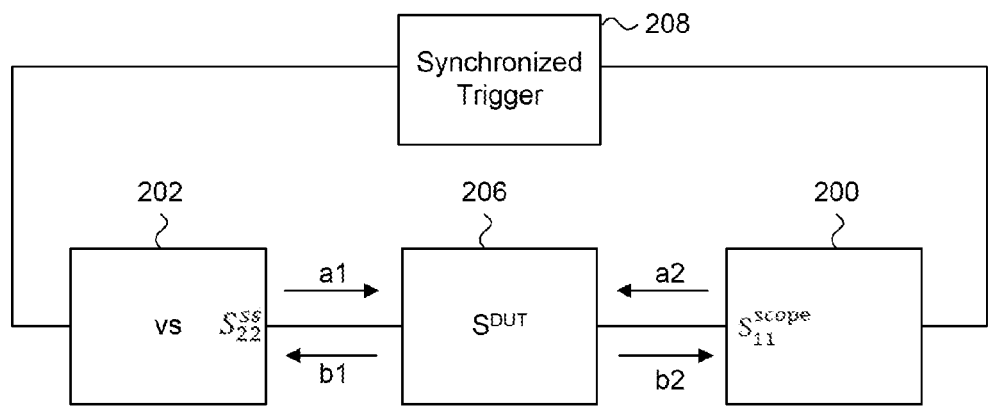
FIG. 5 is a signal flow diagram of the system shown in FIG. 4.

The insertion loss and/or crosstalk terms $s_{12}^{DUT}$, $s_{21}^{DUT}$ may be measured using the system shown in FIG. 4. This system includes the signal generator 202, the DUT 206, the real-time oscilloscope 200 and the synchronized trigger 208. The synchronized trigger 208 provides the time reference so the phases of the measured S-parameters are correct. The signal flow diagram of the system in FIG. 4 can be seen in FIG. 5.

The transfer function from the signal generator's 202 voltage source to the input to the real-time oscilloscope can be derived in the same way as equation (6):

$$\frac{b_2}{v_s} = \frac{1}{2} \cdot \frac{1 - s_{22}^{ss}}{(1 - s_{22}^{ss} s_{11}^{DUT}) s_{11}^{DUT-1}(1 - s_{22}^{DUT} s_{11}^{scope}) - s_{22}^{ss} s_{12}^{DUT} s_{11}^{scope}} \quad (13)$$

Using the assumptions of equation (11), equation (13) can be approximated as $$\frac{b_2}{v_s} = \frac{1}{2} \cdot \frac{(1 - s_{22}^{ss}) s_{21}^{DUT}}{1 - s_{22}^{ss} s_{11}^{DUT} - s_{22}^{DUT} s_{11}^{scope}} \quad (14)$$

Since $s_{11}^{DUT}$ and $s_{22}^{DUT}$ have been calculated as discussed above, there is only one unknown variable, $s_{21}^{DUT}$, in equation (14). Therefore, equation (14) can be solved for $s_{21}^{DUT}$. $b_2$ in equation (14) is the voltage acquired by the oscilloscope 200 when $v_s$ is generated when the devices are configured as in FIG. 4.

To measure $s_{12}^{DUT}$, port two of DUT 206 is connected to the signal generator 202, port one of DUT 206 is connected to the real-time oscilloscope 200, and the same procedure that measures $s_{21}^{DUT}$ may be repeated to measure $s_{12}^{DUT}$.

The method described above may be expanded to measure the reflection coefficients and insertion loss and crosstalk terms for a multi-port DUT. To measure an N-port network, the reflection coefficients can be measured and calculated by terminating all the other ports of the DUT, except the port connected to the power divider, with an ideal 50 Ohms, using the method described above. Then, the insertion loss and crosstalk terms may be measured by terminating all other ports except two ports connected to the signal generator and to the real-time oscilloscope, using the above-discussed insertion loss and crosstalk measurement method.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

The invention claimed is:

1. A method for determining scattering parameters of a device under test using a real-time oscilloscope, comprising:
    determining a reflection coefficient for a first port of a device under test including:
        terminating a second port of the device under test with a resistor,
        sending, via a signal generator, a first signal to a first port of a power divider,
        measuring, based on a synchronized trigger that provides an absolute time reference between the signal generator and the real-time oscilloscope, a voltage level of the first signal by the real-time oscilloscope at a second port of the power divider while a device under test is connected, via the first port of the device under test, to a third port of the power divider, and
        calculating the reflection coefficient of the first port of the device under test utilizing the measured voltage level of the first signal; and
    determining a reflection coefficient for the second port of the device under test including:
        terminating the first port of the device under test with a resistor,
        sending, via the signal generator, a second signal to the first port of the power divider,
        measuring, based on the synchronized trigger, a voltage level of the second signal by the real-time oscilloscope at a second port of the power divider while a device under test is connected, via the second port of the device under test, to the third port of the power divider, and
        calculating the reflection coefficient of the second port of the device under test utilizing the measured voltage level of the second signal; and
    determining an insertion loss coefficient of the first port of the device under test, including:
        sending, via the signal generator, a third signal to the second port of the device under test and to the real-time oscilloscope;
        measuring, based on the synchronized trigger, a voltage level of the third signal by the real-time oscilloscope at the first port of the device under test;
        calculating, by the real-time oscilloscope, the insertion loss coefficient of the first port utilizing the measured voltage level of the second signal and the determined reflection coefficients of the first port and the second port of the device under test; and
    utilizing, by the real-time oscilloscope, the reflection coefficient and the insertion loss coefficient of the first port of the device under test to perform a de-embed operation.

2. The method of claim 1, wherein the resistor is a 50 Ohm resistor.

3. The method of claim 1, wherein the reflection coefficient of the first port of the device under test is calculated using the equations:

$$\frac{b_2}{v_{s1}} = \frac{1}{2} \cdot \frac{(1 - s_{22}^{ss})(s_{21} + s_{23} \tilde{s}_{11}^{DUT} s_{31})}{1 - s_{22}^{ss} s_{12} \tilde{s}_{11}^{DUT} s_{31} - s_{23} \tilde{s}_{11}^{DUT} s_{32} s_{11}^{scope}}$$

and $$\tilde{s}_{11}^{DUT} = s_{11}^{DUT}[1 - s_{33} s_{11}^{DUT}]^{-1}$$

where $b_2$ is the measured voltage level of the first signal, $v_{s1}$ is the first signal,
$s_{22}^{ss}$ is an impedance of the signal generator,
$s_{21}$, $s_{12}$, $s_{31}$, $s_{23}$, $s_{32}$, $s_{33}$ are the scatter parameter terms of the power divider,
$s_{11}^{scope}$ is an input impedance of the real-time oscilloscope, and
$s_{11}^{DUT}$ is the reflection coefficient.

4. The method of claim 1, wherein the reflection coefficients are calculated for the second port of the device under test using the equations:

$$\frac{b_2}{v_{s2}} = \frac{1}{2} \cdot \frac{(1-s_{22}^{ss})(s_{21}+s_{23}\tilde{s}_{11}^{DUT}s_{31})}{1-s_{22}^{ss}s_{12}\tilde{s}_{11}^{DUT}s_{31}-s_{23}\tilde{s}_{11}^{DUT}s_{32}s_{11}^{scope}}$$

and $$\tilde{s}_{11}^{DUT} = s_{11}^{DUT}[1-s_{33}s_{11}^{DUT}]^{-1}$$

where $b_2$ is the measured voltage level of the second signal,
$v_{s2}$ is the second signal,
$s_{22}^{ss}$ is an impedance of the signal generator,
$s_{21}$, $s_{12}$, $s_{31}$, $s_{23}$, $s_{32}$, $s_{33}$ are the scatter parameter terms of the power divider,
$s_{11}^{scope}$ is an input impedance of the real-time oscilloscope, and
$s_{22}^{DUT}$ is the reflection coefficient.

5. The method of claim 4,
wherein the insertion loss coefficient is calculated for each of the first port and second port of the device under test using the equation:

$$\frac{b_2}{v_s} = \frac{1}{2} \cdot \frac{(1-s_{22}^{ss})s_{21}^{DUT}}{1-s_{22}^{ss}s_{11}^{DUT}-s_{22}^{DUT}s_{11}^{scope}}$$

where $s_{21}^{DUT}$ is the insertion loss coefficient.

* * * * *